[12] United States Patent
Taniguchi et al.

(10) Patent No.: US 11,112,130 B2
(45) Date of Patent: Sep. 7, 2021

(54) REFRIGERATION CYCLE APPARATUS

(71) Applicant: Mitsubishi Electric Corporation, Tokyo (JP)

(72) Inventors: Yoshihiro Taniguchi, Tokyo (JP); Shigeo Takata, Tokyo (JP); Shinsaku Kusube, Tokyo (JP); Takahiko Kobayashi, Tokyo (JP); Takanori Koike, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 86 days.

(21) Appl. No.: 16/318,459

(22) PCT Filed: Sep. 16, 2016

(86) PCT No.: PCT/JP2016/077520
§ 371 (c)(1),
(2) Date: Jan. 17, 2019

(87) PCT Pub. No.: WO2018/051499
PCT Pub. Date: Mar. 22, 2018

(65) Prior Publication Data
US 2019/0293306 A1 Sep. 26, 2019

(51) Int. Cl.
*F24F 1/24* (2011.01)
*H01L 23/427* (2006.01)
(Continued)

(52) U.S. Cl.
CPC ............ *F24F 1/24* (2013.01); *F25B 1/00* (2013.01); *H01L 23/427* (2013.01); *H05K 7/20* (2013.01)

(58) Field of Classification Search
CPC .......... H05K 7/20936; H05K 7/20309; H05K 7/20509; H05K 7/20518; F24F 1/24
See application file for complete search history.

(56) References Cited

U.S. PATENT DOCUMENTS 4,120,019 A * 10/1978 Ahi ..................... F28F 1/20
174/15.2
4,720,981 A * 1/1988 Helt ..................... F25B 40/00
165/80.4
(Continued)

FOREIGN PATENT DOCUMENTS

JP H09-172112 A 6/1997
JP 2002-164487 A 6/2002
(Continued)

OTHER PUBLICATIONS

International Search Report dated Nov. 15, 2016 issued in corresponding international patent application No. PCT/JP2016/077520 (with English translation).

*Primary Examiner* — Christopher R Zerphey
(74) *Attorney, Agent, or Firm* — Posz Law Group, PLC

(57) ABSTRACT

A refrigeration cycle apparatus includes a refrigerant circuit through which refrigerant circulates, a control box in which equipment for controlling the refrigeration cycle apparatus is accommodated, and a refrigerator for cooling a heat emitting body exposed from an opening of the control box. The heat emitting body is the equipment accommodated in the control box. The refrigerator includes a cooling body in contact with the heat emitting body, and a refrigerant pipe through which the refrigerant circulating through the refrigerant circuit passes to cool the cooling body. The refrigerant pipe is in contact with the cooling body. The pipe contact surface is different from the heating-body contact surface. The cooling body has a recessed portion at which the cooling body and the heat emitting body are not in contact with each other. The recessed portion is formed in the heating-body contact surface and spaced from the control box.

7 Claims, 7 Drawing Sheets

(51) Int. Cl.
*F25B 1/00* (2006.01)
*H05K 7/20* (2006.01)

(56) References Cited

U.S. PATENT DOCUMENTS

| | | | | |
|---|---|---|---|---|
| 5,220,809 | A * | 6/1993 | Voss | B60H 1/323 |
| | | | | 62/259.2 |
| 5,651,260 | A * | 7/1997 | Goto | B60H 1/3205 |
| | | | | 165/80.4 |
| 6,219,236 | B1 * | 4/2001 | Hirano | H01L 23/467 |
| | | | | 257/E23.099 |
| 6,604,372 | B2 * | 8/2003 | Baumert | B60H 1/3205 |
| | | | | 62/199 |
| 7,165,602 | B2 * | 1/2007 | Wang | H05K 7/20518 |
| | | | | 165/135 |
| 9,406,586 | B2 * | 8/2016 | Suzuki | H05K 7/20154 |
| 9,510,481 | B2 * | 11/2016 | Fujiwara | H01L 23/473 |
| 10,024,556 | B2 * | 7/2018 | Choi | F24F 1/06 |
| 10,373,891 | B2 * | 8/2019 | Strader | B23P 15/26 |
| 10,477,725 | B2 * | 11/2019 | Chen | H05K 7/20263 |
| 10,495,327 | B2 * | 12/2019 | Doi | H05K 1/0203 |
| 10,624,240 | B2 * | 4/2020 | Leigh | G02B 6/4269 |
| 2011/0126568 | A1 * | 6/2011 | Okuda | H05K 7/2029 |
| | | | | 62/259.2 |
| 2012/0255318 | A1 | 10/2012 | Kido et al. | |
| 2012/0279251 | A1 * | 11/2012 | Kido | F24F 1/24 |
| | | | | 62/498 |
| 2016/0120059 | A1 * | 4/2016 | Shedd | F28F 13/02 |
| | | | | 165/244 |
| 2017/0115013 | A1 * | 4/2017 | Kim | F24F 13/20 |
| 2019/0045662 | A1 * | 2/2019 | Schroeder | H05K 7/20272 |
| 2019/0301753 | A1 * | 10/2019 | Taniguchi | F24F 1/24 |

FOREIGN PATENT DOCUMENTS

| | | |
|---|---|---|
| JP | 4006782 B2 | 11/2007 |
| JP | 2008-057852 A | 3/2008 |
| JP | 5125355 B2 | 1/2013 |
| JP | 2013-135177 A | 7/2013 |
| JP | 2014-102050 A | 6/2014 |
| JP | 5516602 B2 | 6/2014 |
| JP | 5626439 B2 | 11/2014 |
| JP | 5659795 B2 | 1/2015 |
| WO | 2007/119544 A1 | 10/2007 |

* cited by examiner

REFRIGERATION CYCLE APPARATUS

CROSS REFERENCE TO RELATED APPLICATION

This application is a U.S. national stage application of International Application No. PCT/JP2016/077520, filed on Sep. 16, 2016, the contents of which are incorporated herein by reference.

TECHNICAL FIELD

The present invention relates to a refrigeration cycle apparatus, and more particularly, to a structure for protecting an electrical component or other components from condensation that occurs when a refrigerator cools a heat emitting body such as an electrical component.

BACKGROUND

A known refrigeration cycle apparatus includes a cooling mechanism that uses refrigerant that circulates through a refrigerant circuit to cool a heat emitting body such as an electrical component that is disposed in a control box. In some cases, cooling the heat emitting body causes condensation in the control box that accommodates the heat emitting body. For example, when the cooling mechanism and the control box are in contact with each other, the ambient temperature in a region of the control box far from the heat emitting body falls to less than the dew point due to cooling by the cooling mechanism, and condensation occurs. In view of this, to prevent moisture related to condensation from adversely affecting, for example, an electrical component such as control equipment, a hygroscopic agent such as zeolite or silica gel is used to adsorb the moisture (see, for example, Patent Literature 1).

PATENT LITERATURE

Patent Literature 1: Japanese Patent No. 5659795

However, in the case where the hygroscopic agent is used to protect the electrical component as disclosed in, for example, Patent Literature 1, maintenance is needed, for example, when the hygroscopic agent deteriorates or the ability to adsorb moisture reaches the limit thereof. For this reason, the use of the hygroscopic agent is not suited for, for example, an outdoor unit of an air-conditioning apparatus in an outdoor environment.

SUMMARY

The present invention has been accomplished to overcome the above problem, and an object of the present invention is to provide a refrigeration cycle apparatus that protects an electrical component or other components while cooling by a refrigerator.

A refrigeration cycle apparatus according to an embodiment of the present invention includes a refrigerant circuit through which refrigerant circulates, a control box in which equipment for controlling the refrigeration cycle apparatus is accommodated, and a refrigerator for cooling a heat emitting body exposed from an opening of the control box. The heat emitting body is the equipment accommodated in the control box. The refrigerator includes a cooling body having a heating-body contact surface in contact with the heat emitting body, and a refrigerant pipe through which a part or all of the refrigerant circulating through the refrigerant circuit passes to cool the cooling body. The refrigerant pipe is in contact with a pipe contact surface of the cooling body. The pipe contact surface is different from the heating-body contact surface. The cooling body has a recessed portion at which the cooling body and the heat emitting body are not in contact with each other. The recessed portion is formed in the heating-body contact surface and spaced from the control box.

According to the embodiment of the present invention, since the cooling body has the recessed portion at which the cooling body and the heat emitting body are not in contact with each other, and the recessed portion is formed in the heating-body contact surface and spaced from the control box, the area of contact between the refrigerant pipe and the pipe contact surface of the cooling body is ensured, cooling capacity to cool the heat emitting body is ensured, the portion in the heating-body contact surface where the cooling body and the heat emitting body are not in contact with each other is spaced from control box, and air is interposed between the cooling body and the control box. This enables condensation in the control box to be inhibited from occurring and enables exposure of an electrical component or other components to moisture related to condensation to be avoided. Consequently, the electrical component or other components can be protected.

DETAILED DESCRIPTION

Figure 1:
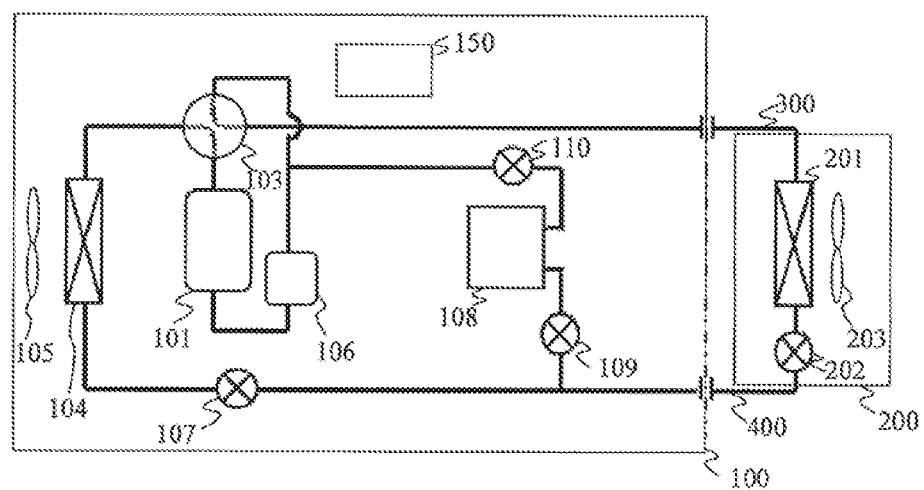
FIG. 1 illustrates the structure of an air-conditioning apparatus according to Embodiment 1 of the present invention.

Refrigeration cycle devices according to embodiments of the invention will hereinafter be described with reference to, for example, the drawings. An air-conditioning apparatus is described herein as an example of each refrigeration cycle apparatus. In the drawings, components designated by like reference signs are components like or corresponding to each other. This is common throughout the embodiments described below. The forms of components in the whole sentences of the description are described by way of example, and the components are not limited to the forms in the description. In particular, combinations of the components are not limited to combinations according to the embodiments, and a component described according to an embodiment can be used for other embodiments. The magnitude of pressure and temperature is not determined by a relation with an absolute value but is determined in a relative manner depending on, for example, a state or operation of a device or other equipment. Regarding the same kind of equipment, for example, distinguished by subscripts, the subscripts, for example, are omitted in the description when it is not necessary for the equipment to be distinguished or specified in some cases. In some cases, the relationship between the sizes of the components in the drawings differs from the actual relationship.

Embodiment 1

FIG. 1 illustrates the structure of an air-conditioning apparatus according to Embodiment 1 of the present invention. The air-conditioning apparatus in FIG. 1 includes a heat source unit (outdoor unit) 100 and a load unit (indoor unit) 200. These are connected to each other by pipes and make up a refrigerant circuit, and refrigerant is circulated therethrough. Among the pipes, a pipe through which a gas refrigerant flows is a gas pipe 300, and a pipe through which a liquid refrigerant (a two-phase gas-liquid refrigerant in some cases) flows is a liquid pipe 400.

According to Embodiment 1, the heat source unit 100 includes a compressor 101, a four-way valve 103, an outdoor heat exchanger 104, an outdoor fan 105, an accumulator (gas-liquid separator) 106, an outdoor expansion device (expansion valve) 107, a refrigerator 108, a first bypass refrigerant amount regulating valve 109, and a second bypass refrigerant amount regulating valve 110. The compressor 101, the four-way valve 103, the outdoor heat exchanger 104, the accumulator 106, and the outdoor expansion device 107 correspond to equipment on the main refrigerant circuit. The refrigerator 108, the first bypass refrigerant amount regulating valve 109, and the second bypass refrigerant amount regulating valve 110 correspond to equipment on a bypass flow path. The bypass flow path is made in a manner in which a pipe between the outdoor expansion device (expansion valve) 107 and a load expansion device 202 and a pipe through which the refrigerant flows into the accumulator 106 are connected to each other by bypass pipes.

The compressor 101 sucks, compresses, and discharges the refrigerant. The compressor 101 preferably includes an inverter device or other devices and is preferably capable of slightly changing the capacity (the amount of the refrigerant that is fed per unit time) of the compressor 101 by freely changing a driving frequency. The four-way valve 103 changes the flow of the refrigerant between cooling operation and heating operation in response to instructions from a controller 150.

The outdoor heat exchanger 104 exchanges heat between the refrigerant and air (outdoor air). For example, during heating operation, the outdoor heat exchanger functions as an evaporator, exchanges heat between air and the refrigerant that flows therein via the outdoor expansion device 107 and that has a low pressure, and evaporates and gasifies the refrigerant. During cooling operation, the outdoor heat exchanger functions as a condenser, exchanges heat between air and the refrigerant that is compressed by the compressor 101 and that flows therein from the four-way valve 103, and condenses and liquefies the refrigerant. The outdoor fan 105 is disposed to be associated with the outdoor heat exchanger 104 for efficient heat exchange between the refrigerant and air. The outdoor fan 105 may be configured to slightly change the rotation speed of a propeller or similar device, for example, by freely changing the driving frequency of a fan motor with an inverter device.

The first bypass refrigerant amount regulating valve 109 and the second bypass refrigerant amount regulating valve 110 adjust the flow rate and pressure of the refrigerant that flows into the refrigerator 108. For example, the first bypass refrigerant amount regulating valve 109 and the second bypass refrigerant amount regulating valve 110 each include a solenoid valve, an electronic expansion valve, and a capillary tube.

The refrigerator 108 exchanges heat between a heat emitting body 5 described later and the refrigerant whose flow rate and pressure are adjusted by the first bypass refrigerant amount regulating valve 109 and the second bypass refrigerant amount regulating valve 110 to cool the heat emitting body 5.

The first bypass refrigerant amount regulating valve 109 and the second bypass refrigerant amount regulating valve 110 are disposed on a refrigerant inflow side (high-pressure side) and a refrigerant outflow side (low-pressure side) of the refrigerator 108. This enables the pressure of the refrigerant that flows into the refrigerator 108 to be adjusted to an intermediate pressure. The adjustment of the pressure enables the temperature of the refrigerant that flows into the refrigerator 108 to be freely adjusted to a temperature between a refrigerant temperature on the high-pressure side and a refrigerant temperature on the low-pressure side. The second bypass refrigerant amount regulating valve 110 is equipment that may be provided or omitted. For example, costs can be decreased in a manner in which the second bypass refrigerant amount regulating valve 110 is not provided. The refrigerant that passes through the second bypass refrigerant amount regulating valve 110 returns to the accumulator 106.

An example of the accumulator 106 is equipment that stores an excess of the liquid refrigerant.

The controller 150 controls the entire air-conditioning apparatus, for example, equipment that makes up the refrigerant circuit. In particular, here, the controller controls the first bypass refrigerant amount regulating valve 109 and the second bypass refrigerant amount regulating valve 110 such that the flow rate and pressure of the refrigerant that flows through the refrigerator 108 are adjusted to adjust the cooling capacity of the refrigerator 108.

The load unit 200 includes a load heat exchanger 201, the load expansion device (expansion valve) 202, and a load fan 203. The load heat exchanger 201 exchanges heat between the refrigerant and air. For example, during heating operation, the load heat exchanger functions as a condenser, exchanges heat between air and the refrigerant that flows therein from the gas pipe 300, condenses and liquefies the refrigerant (or turns the refrigerant into two-phase gas-liquid refrigerant), and discharges the refrigerant into the liquid pipe 400. During cooling operation, the bad heat exchanger functions as an evaporator, exchanges heat between air and the refrigerant the pressure of which is decreased to a low pressure by the load expansion device 202, evaporates and gasifies the refrigerant by causing the refrigerant to absorb the heat of the air, and discharges the refrigerant into the gas pipe 300. In the bad unit 200, the load fan 203 is disposed to be associated with the outdoor heat exchanger 104. The load fan 203 adjusts the flow of the air the heat of which is to be exchanged by the load heat exchanger 201. The driving speed of the load fan 203 is determined by user settings. The load expansion device 202 adjusts the flow rate and pressure of the refrigerant in the load heat exchanger 201.

Figure 2:
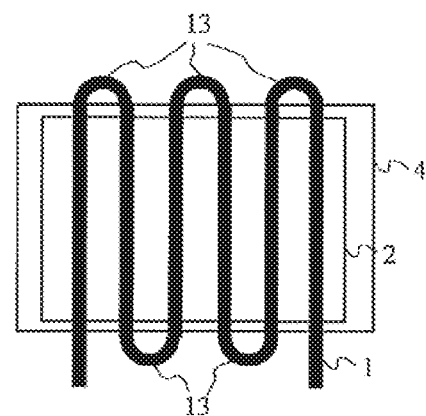
FIG. 2 is a schematic diagram of a refrigerator 108 of the air-conditioning apparatus according to Embodiment 1 of the present invention viewed from the front of a refrigerant-pipe contact surface.
Figure 3:
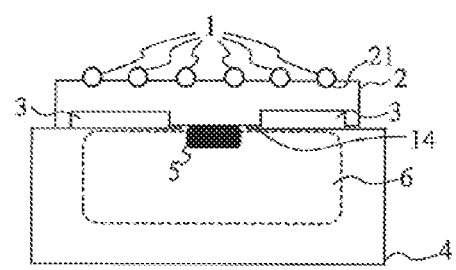
FIG. 3 illustrates the relationship of contact between the refrigerator 108 and a control box 4 of the air-conditioning apparatus according to Embodiment 1 of the present invention.
Figure 4:
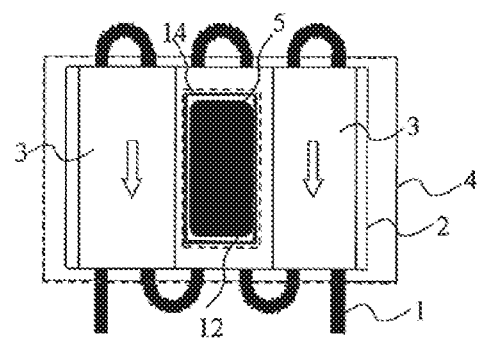
FIG. 4 is a schematic diagram of the refrigerator 108 of the air-conditioning apparatus according to Embodiment 1 of the present invention viewed from a heating-body contact surface.

FIG. 2 is a schematic diagram of the refrigerator 108 of the air-conditioning apparatus according to Embodiment 1 of the present invention viewed from the front of a refrigerant-pipe contact surface. FIG. 3 illustrates the relationship of contact between the refrigerator 108 and a control box 4 of the air-conditioning apparatus according to Embodiment 1 of the present invention. FIG. 4 is a schematic diagram of the refrigerator 108 of the air-conditioning apparatus according to Embodiment 1 of the present invention viewed from a heating-body contact surface.

Here, it is assumed, for example, that the refrigerator 108 of the air-conditioning apparatus according to Embodiment 1 is disposed such that, an upper portion of the refrigerator 108 in FIG. 2 and FIG. 4, is higher than that of a lower portion. In this case, moisture due to condensation flows in the direction illustrated by arrows in FIG. 4. It is assumed that the same is true for refrigerators 108 according to other embodiments described later.

As illustrated in FIG. 2 to FIG. 4, the refrigerator 108 includes a refrigerant pipe 1 and a cooling plate 2 that serves as a cooling body. In the refrigerator 108, the refrigerant pipe 1 through which the refrigerant passes is in contact with the refrigerant-pipe contact surface of the cooling plate 2 to which the heat of the refrigerant that flows through the refrigerant pipe 1 is transferred. The heating-body contact surface of the cooling plate 2 is in contact with the heat emitting body 5 exposed from the control box 4.

The refrigerant pipe 1 is connected to the bypass pipes and corresponds to a part of the bypass flow path. According to Embodiment 1, the refrigerant pipe 1 includes turn portions 13 where the refrigerant pipe is bent back toward the cooling plate 2 to increase the area of contact with the cooing plate 2. In FIG. 2, the refrigerant pipe 1 is bent back four times, and the number of the turn portions 13 is five. The number of turns is four. When the bend radius of the turn portions 13 is too small, there is a possibility that the inner diameter of the refrigerant pipe 1 is changed and that a refrigerant flow path is narrowed. For this reason, the bend radius is preferably a radius suitable for the diameter of the pipe. As the number of turns of the refrigerant pipe 1 increases, the area of contact between the refrigerant pipe 1 and the cooling plate 2 increases, and consequently, the cooling capacity of the refrigerator 108 to cool the heat emitting body 5 can be increased.

A circular pipe, a flat pipe, or other pipes for use in the outdoor unit of the air-conditioning apparatus can be used as the refrigerant pipe 1. In particular, the use of the flat pipe enables the area of contact with the cooling plate 2 to be increased, and the refrigerant pipe 1 is preferably the flat pipe.

A heat transfer sheet or heat transfer grease the material of which contains, for example, silicone or carbon is interposed between the refrigerant pipe 1 and the cooling plate 2 to increase adhesion, and this enables thermal resistance to be decreased. For example, in the case where the material of the refrigerant pipe 1 and the material of the cooling plate 2 are a metal containing aluminum, the refrigerant pipe 1 and the cooling plate 2 are preferably brazed with aluminum. Brazing with aluminum enables the thermal resistance to be lower than that in the case of using, for example, the heat transfer sheet or the heat transfer grease.

The control box 4 accommodates, for example, electric-powered devices or equipment such as the controller and a communication device, and an example thereof is a box composed of a metal plate. While an electrical component that is accommodated in an electrical-component storage compartment 6 inside the control box 4 is energized, the electrical component causes electrical loss therein and becomes the heat emitting body 5 that generates heat. In particular, the heat emitting body 5 that generates a large amount of heat needs to be cooled. Examples of the heat emitting body 5 that needs to be cooled include a power module used in an inverter device for driving, for example, the compressor 101 or the outdoor fan 105, and semiconductor components such as a diode stack, a microcomputer, and a regulator. In addition, components including a winding such as a common mode choke coil, a DC reactor, and a mechanical relay, and an electrolytic capacitor are also included.

The heat emitting body 5 according to Embodiment 1 includes a wide-bandgap semiconductor the material of which contains, for example, silicon carbide (SiC), gallium nitride (GaN), or diamond. Such a wide-bandgap semiconductor has a high voltage resistance and a high allowable current, and the size of an element is decreased. Since the size of the element is small, the size of a semiconductor module including the element can also be decreased. In addition, the wide-bandgap semiconductor has a high heat resistance. Consequently, the size of a cooling mechanism that is needed to transfer heat can be decreased, enabling simplification of system of cooling, and the size of the semiconductor module can be further decreased. In addition, the power loss of the wide-bandgap semiconductor is small. The heat emitting body 5 may be composed of a material containing silicon (Si).

The structure of the cooling plate 2 will be described. The cooling plate 2 transfers the heat (mainly the cooling energy) of the refrigerant that passes through the refrigerant pipe 1. Here, the shape of the cooling plate 2 is, but not particularly limited to, a rectangular cuboid shape. The refrigerant-pipe contact surface of the cooling plate 2 has grooves 21 each of which fits the shape of the outer surface of the refrigerant pipe 1. For example, when the refrigerant pipe 1 is the circular pipe, the shape of each groove 21 is a semicircular groove shape. When the refrigerant pipe 1 is the flat pipe, the shape of each groove is a shape including a linear region and arc regions on both sides of the linear region. In the case where the cooling plate 2 has the grooves along the outer surface of the refrigerant pipe 1, the area of contact between the refrigerant pipe 1 and the cooling plate 2 can be larger than that in the case where a refrigerant-pipe disposition surface of the cooling plate 2 is flat. Examples of the material of the cooling plate 2 include a metal containing copper or aluminum. In consideration of electric corrosion between the refrigerant pipe 1 and the cooling plate 2, the same material as the refrigerant pipe 1 is preferably chosen as the material of the cooling plate 2.

The structure of the cooling plate 2 on a heating-body contact side, that is, a surface opposite to the refrigerant-pipe contact surface will now be described. As illustrated in, for example, FIG. 4, the cooling plate 2 is in contact with the heat emitting body 5 exposed from a metal-plate opening 12 that the control box 4 has. As illustrated in FIG. 2, the refrigerant pipe 1 is preferably bent back such that the turn portions 13 are formed to ensure sufficient cooling capacity for the amount of heat that the heat emitting body 5 generates. When the number of turns is large, the size of the cooling plate 2 is larger than the size of the heat emitting body 5.

For example, when the size of the cooling plate 2 is much larger than the size of the heat emitting body 5, a region of the control box 4 other than the metal-plate opening 12 is in contact with or is adjacent to the cooling plate 2, and the control box 4 is cooled. In the electrical-component storage compartment 6 inside the control box 4, for example, the temperature of air around the heat emitting body 5 does not reach the dew point because of the heat that the heat emitting body 5 generates. However, when air cools to the dew point or less in a region positioned away from the heat emitting body 5, condensation occurs. Moisture due to the condensation results in, for example, corrosion, a short circuit, or breakage of the electrical component.

For example, in the case where the flow rate and temperature of the refrigerant that flows through the refrigerator 108 can be controlled by using the first bypass refrigerant amount regulating valve 109 and the second bypass refrigerant amount regulating valve 110 as illustrated in FIG. 1, the temperature of the refrigerant can be adjusted such that condensation does not occur in the control box 4. However, for example, in the case where the second bypass refrigerant amount regulating valve 110 is not provided to reduce costs, or in the case where an open failure of the second bypass refrigerant amount regulating valve 110 occurs, the refrigerator 108 communicates with a low-pressure-side pipe. For this reason, the pressure and temperature of the refrigerant that flows through the refrigerator 108 are close to the pressure and the temperature on the low-pressure side, and there is a high possibility that condensation occurs.

Since an area where condensation may occur in the electrical-component storage compartment 6 inside the control box 4 can be expected, it is considered that the position of the electrical component is changed such that condensation does not affect the electrical component. However, it can be also considered that the position of the electrical component cannot be changed, for example, to decrease the size of a device in the control box 4.

In view of this, the refrigerator 108 according to Embodiment 1 has recessed portions 3, where the refrigerator 108 and the heat emitting body 5 are not in contact with each other, in the heating-body contact surface of the cooling plate 2. In particular, the recessed portions 3 are formed preferably in regions away from the heat emitting body 5 to which the heat of the heat emitting body 5 is not transferred. At the recessed portions 3, the cooling plate 2 and the control box 4 are neither in contact with each other nor are adjacent to each other, and sufficient spaces can be secured therebetween. Air present between the cooling plate 2 and the control box 4 decreases the cooling capacity of the cooling plate 2 to cool the control box 4. The air in the recessed portions 3 is cooled. For this reason, there is a possibility that condensation occurs on the outer surface of the control box 4 and the recessed portions 3 of the cooling plate 2. However, condensation in the electrical-component storage compartment 6 can be prevented from occurring.

A sealant 14 surrounds the metal-plate opening 12, for example, to prevent condensed moisture on the outer surface of the control box 4 and the recessed portions 3 of the cooling plate 2 from entering the control box 4 via the metal-plate opening 12. The sealant 14 is, for example, a resin material, is disposed between the cooling plate 2 and the control box 4, and covers the metal-plate opening 12.

Since the air-conditioning apparatus according to Embodiment 1 is provided with the recessed portions 3, where the refrigerator 108 and the heat emitting body 5 are not in contact with each other, in the heating-body contact surface of the cooling plate 2 of the refrigerator 108 as described above, the spaces can be formed between the cooling plate 2 and the control box 4, air interposed therebetween decreases the cooling capacity to cool the control box 4, and condensation in the electrical-component storage compartment 6 can be prevented from occurring. Consequently, the electrical component can be protected.

Embodiment 2

Figure 5:
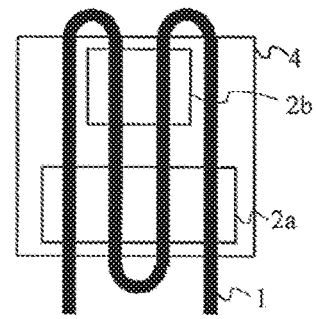
FIG. 5 is a schematic diagram of a refrigerator 108 of an air-conditioning apparatus according to Embodiment 2 of the present invention viewed from the front of refrigerant-pipe contact surfaces.
Figure 6:
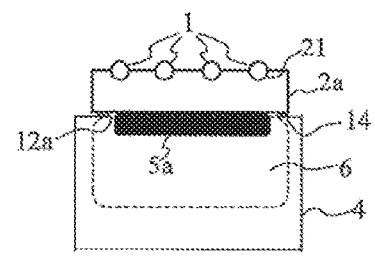
FIG. 6 illustrates the relationship of contact between the refrigerator 108 and a control box 4 of the air-conditioning apparatus according to Embodiment 2 of the present invention (Part 1).
Figure 7:
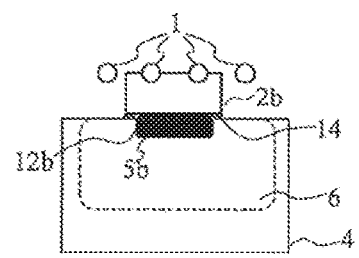
FIG. 7 illustrates the relationship of contact between the refrigerator 108 and the control box 4 of the air-conditioning apparatus according to Embodiment 2 of the present invention (Part 2).
Figure 8:
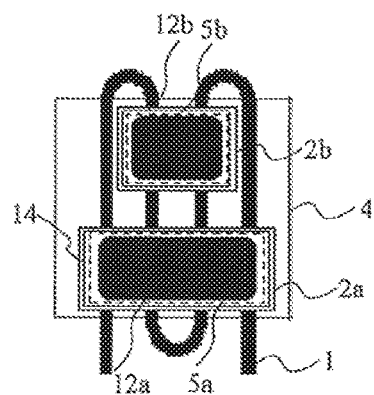
FIG. 8 is a schematic diagram of the refrigerator 108 of the air-conditioning apparatus according to Embodiment 2 of the present invention viewed from the front of heating-body contact surfaces.

FIG. 5 is a schematic diagram of a refrigerator 108 of an air-conditioning apparatus according to Embodiment 2 of the present invention viewed from the front of refrigerant-pipe contact surfaces. FIG. 6 and FIG. 7 illustrate the relationship of contact between the refrigerator 108 and a control box 4 of the air-conditioning apparatus according to Embodiment 2 of the present invention. FIG. 8 is a schematic diagram of the refrigerator 108 of the air-conditioning apparatus according to Embodiment 2 of the present invention viewed from the front of heating-body contact surfaces.

The refrigerator 108 of the air-conditioning apparatus according to Embodiment 2 will be described by using an example in which there are two or more heating bodies 5. According to Embodiment 2, there are two heating bodies 5a and 5b. The heat emitting body 5a is exposed from a metal-plate opening 12a of the control box 4, and the heat emitting body 5b is exposed from a metal-plate opening 12b of the control box 4. The area of a portion of the heat emitting body 5b that is exposed from the metal-plate opening 12b is smaller than the area of a portion of the heat emitting body 5a that is exposed from the metal-plate opening 12a. The amount of heat that the heat emitting body 5b generates is smaller than the amount of heat that the heat emitting body 5a generates.

According to Embodiment 2, a plurality of cooling plates 2 are prepared, for example, based on the number of the heating bodies 5. The refrigerator 108 includes the cooling plates 2 and a refrigerant pipe 1 that are in contact with each other. Consequently, the refrigerator 108 according to Embodiment 2 includes two cooing plates 2 and the refrigerant pipe 1 that are in contact with each other.

The area of contact between the refrigerant pipe 1 and a cooling plate 2a is determined such that sufficient cooling capacity for the amount of heat that the heat emitting body 5a generates can be ensured, and the refrigerant pipe 1 and the cooling plate 2a are mounted. A cooling plate 2b and the refrigerant pipe 1, which can ensure sufficient cooling capacity for the amount of heat that the heat emitting body 5b generates, are brought into contact with each other and mounted. At this time, the size of the cooling plate 2b is determined such that the area of contact between the cooling plate 2b and the refrigerant pipe 1 is appropriate for the amount of heat that the heat emitting body 5b generates. The amount of heat that the heat emitting body 5b generates is smaller than the amount of heat that the heat emitting body 5a generates as described above. Consequently, the size of the cooing plate 2b is smaller than the size of the cooling plate 2a.

The refrigerator 108 having the above structure according to Embodiment 2 deals with a plurality of the heating bodies 5, and the cooling plates 2 are in contact therewith so as to depend on the amount of heat generated and the size. Consequently, a region of the control box 4 far from the heat emitting body 5 and the cooling plates 2 are not in contact with each other, condensation in an electrical-component storage compartment 6 inside the control box 4 can be prevented from occurring, and corrosion, a short circuit, and breakage of each electrical component due to condensation, for example, can be avoided.

Embodiment 3

Figure 9:
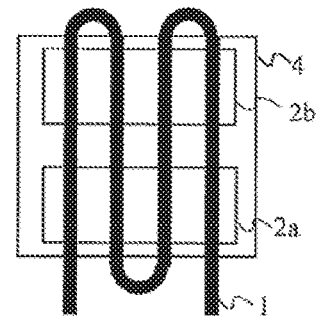
FIG. 9 is a schematic diagram of a refrigerator 108 of an air-conditioning apparatus according to Embodiment 3 of the present invention viewed from the front of refrigerant-pipe contact surfaces.
Figure 10:
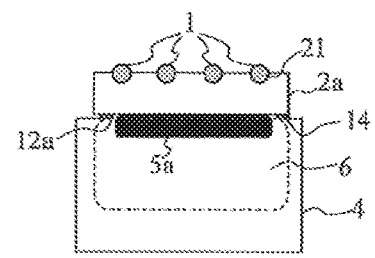
FIG. 10 illustrates the relationship of contact between the refrigerator 108 and a control box 4 of the air-conditioning apparatus according to Embodiment 3 of the present invention (Part 1).
Figure 11:
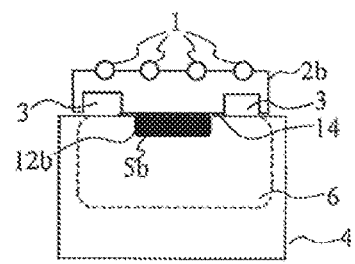
FIG. 11 illustrates the relationship of contact between the refrigerator 108 and the control box 4 of the air-conditioning apparatus according to Embodiment 3 of the present invention (Part 2).
Figure 12:
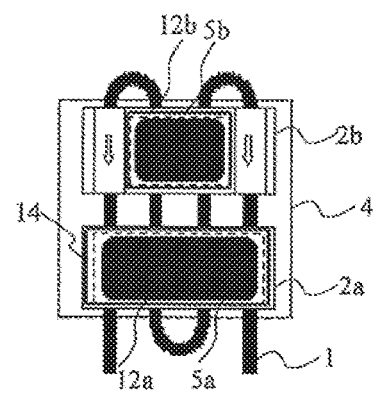
FIG. 12 is a schematic diagram of the refrigerator 108 of the air-conditioning apparatus according to Embodiment 3 of the present invention viewed from the front of heating-body contact surfaces.

FIG. 9 is a schematic diagram of a refrigerator 108 of an air-conditioning apparatus according to Embodiment 3 of the present invention viewed from the front of refrigerant-pipe contact surfaces. FIG. 10 and FIG. 11 illustrate the relationship of contact between the refrigerator 108 and a control box 4 of the air-conditioning apparatus according to Embodiment 3 of the present invention. FIG. 12 is a schematic diagram of the refrigerator 108 of the air-conditioning apparatus according to Embodiment 3 of the present invention viewed from the front of heating-body contact surfaces.

In some cases, a plurality of heating bodies 5 generate substantially the same amount of heat, for example, even when the portions of the heating bodies 5 that are exposed from metal-plate openings 12 have different areas. In these cases, cooling plates 2 have substantially the same cooling capacity. In view of this, according to Embodiment 3, a cooling plate 2b of the refrigerator 108 has recessed portions 3 because it is necessary for the areas of contact between a refrigerant pipe 1 and the cooling plates 2 to be substantially the same. Since the cooling plate 2b has the recessed portions 3, the cooling plate 2b and the control box 4 are neither in contact with each other nor are adjacent to each other, condensation in an electrical-component storage compartment 6 is prevented from occurring, and corrosion, a short circuit, and breakage of each electrical component due to condensation, for example, can be avoided.

Embodiment 4

Figure 13:
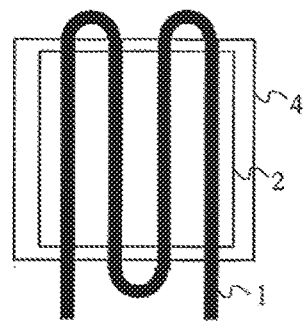
FIG. 13 is a schematic diagram of a refrigerator 108 of an air-conditioning apparatus according to Embodiment 4 of the present invention viewed from the front of a refrigerant-pipe contact surface.
Figure 14:
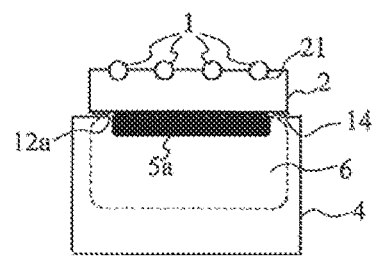
FIG. 14 illustrates the relationship of contact between the refrigerator 108 and a control box 4 of the air-conditioning apparatus according to Embodiment 4 of the present invention (Part 1).
Figure 15:
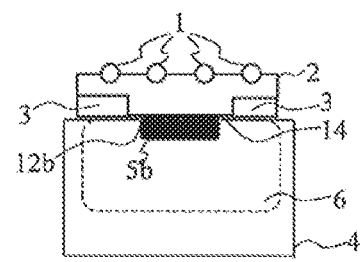
FIG. 15 illustrates the relationship of contact between the refrigerator 108 and the control box 4 of the air-conditioning apparatus according to Embodiment 4 of the present invention (Part 2).
Figure 16:
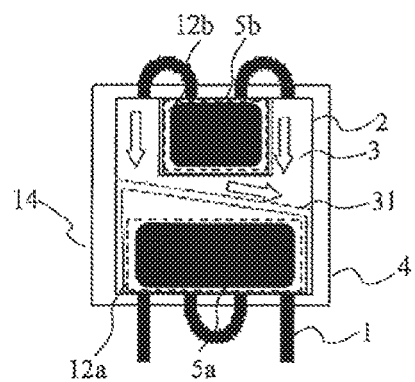
FIG. 16 is a schematic diagram of the refrigerator 108 of the air-conditioning apparatus according to Embodiment 4 of the present invention viewed from a heating-body contact surface.

FIG. 13 is a schematic diagram of a refrigerator 108 of an air-conditioning apparatus according to Embodiment 4 of the present invention viewed from the front of a refrigerant-pipe contact surface. FIG. 14 and FIG. 15 illustrate the relationship of contact between the refrigerator 108 and a control box 4 of the air-conditioning apparatus according to Embodiment 4 of the present invention. FIG. 16 is a schematic diagram of the refrigerator 108 of the air-conditioning apparatus according to Embodiment 4 of the present invention viewed from a heating-body contact surface.

According to Embodiment 2 and Embodiment 3, the structure of each refrigerator 108 that includes the cooling plates 2 depends on the heating bodies 5. The refrigerator 108 according to Embodiment 4 does not include a plurality of cooling plates 2 but includes a single cooling plate 2 for a plurality of heating bodies 5 for the purpose of, for example, machinability and improvement in strength against vibrations.

A part of a recessed portion 3 is an inclined portion 31 that is inclined in the vertical direction. This allows moisture in the recessed portion 3 to flow down from the cooling plate 2 along the inclined portion 31 as illustrated by arrows in FIG. 16. Consequently, the moisture can be prevented from entering the control box 4.

Embodiment 5

Figure 17:
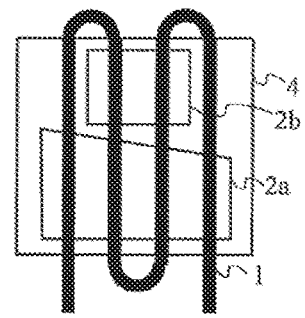
FIG. 17 is a schematic diagram of a refrigerator 108 of an air-conditioning apparatus according to Embodiment 5 of the present invention viewed from the front of refrigerant-pipe contact surfaces.
Figure 18:
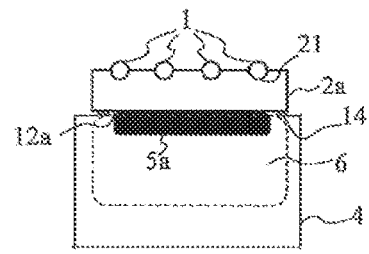
FIG. 18 illustrates the relationship of contact between the refrigerator 108 and a control box 4 of the air-conditioning apparatus according to Embodiment 5 of the present invention (Part 1).
Figure 19:
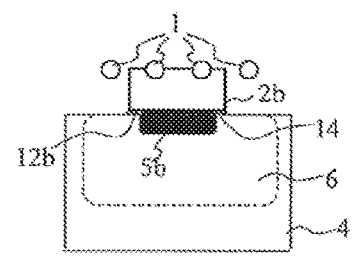
FIG. 19 illustrates the relationship of contact between the refrigerator 108 and the control box 4 of the air-conditioning apparatus according to Embodiment 5 of the present invention (Part 2).
Figure 20:
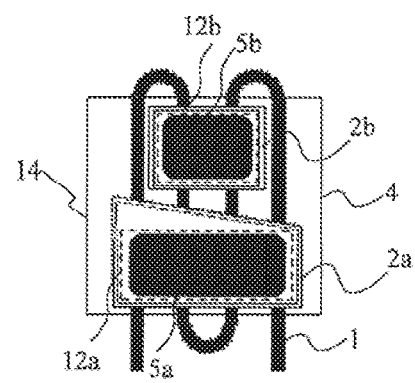
FIG. 20 is a schematic diagram of the refrigerator 108 of the air-conditioning apparatus according to Embodiment 5 of the present invention viewed from heating-body contact surfaces.

FIG. 17 is a schematic diagram of a refrigerator 108 of an air-conditioning apparatus according to Embodiment 5 of the present invention viewed from the front of refrigerant-pipe contact surfaces. FIG. 18 and FIG. 19 illustrate the relationship of contact between the refrigerator 108 and a control box 4 of the air-conditioning apparatus according to Embodiment 5 of the present invention. FIG. 20 is a schematic diagram of the refrigerator 108 of the air-conditioning apparatus according to Embodiment 5 of the present invention viewed from heating-body contact surfaces.

According to Embodiment 5, when the refrigerator 108 is manufactured with a plurality of cooling plates 2, for example, a cooling plate 2a located on the lower side is formed into a trapezoidal shape. The cooling plate 2a formed into the trapezoidal shape includes an inclined portion 31. For example, moisture that flows down from a cooling plate 2b flows down from the cooling plate 2a along the inclined portion 31. Consequently, the moisture can be prevented from entering the control box 4.

Embodiment 6

Figure 21:
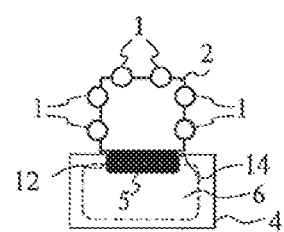
FIG. 21 illustrates the relationship of contact between a refrigerator 108 and a control box 4 of an air-conditioning apparatus according to Embodiment 6 of the present invention.

FIG. 21 illustrates the relationship of contact between a refrigerator 108 and a control box 4 of an air-conditioning apparatus according to Embodiment 6 of the present invention. For example, when the area of contact is required for contact with six lines of a refrigerant pipe 1 to achieve sufficient cooling capacity for the amount of heat that a heat emitting body 5 generates, the size of a cooling plate 2 increases in some cases where only a surface opposite a heating-body contact surface is used as a refrigerant-pipe contact surface.

In view of this, according to Embodiment 6, the area of contact with the refrigerant pipe 1 is increased in a manner in which surfaces of the cooling plate 2 other than the heating-body contact surface are used as the refrigerant-pipe contact surfaces. This enables the width of the cooling plate 2 to be decreased, and the control box 4 and the cooling plate 2 are not in contact with each other. Consequently, condensation in an electrical-component storage compartment 6 is prevented from occurring, and corrosion, a short circuit, and breakage of an electrical component due to condensation, for example, can be avoided.

The structure and shape of the refrigerator 108 according to Embodiment 6 can be used for, for example, the refrigerator 108 according to Embodiment 2, Embodiment 3, Embodiment 4, or Embodiment 5.

Embodiment 7

Figure 22:
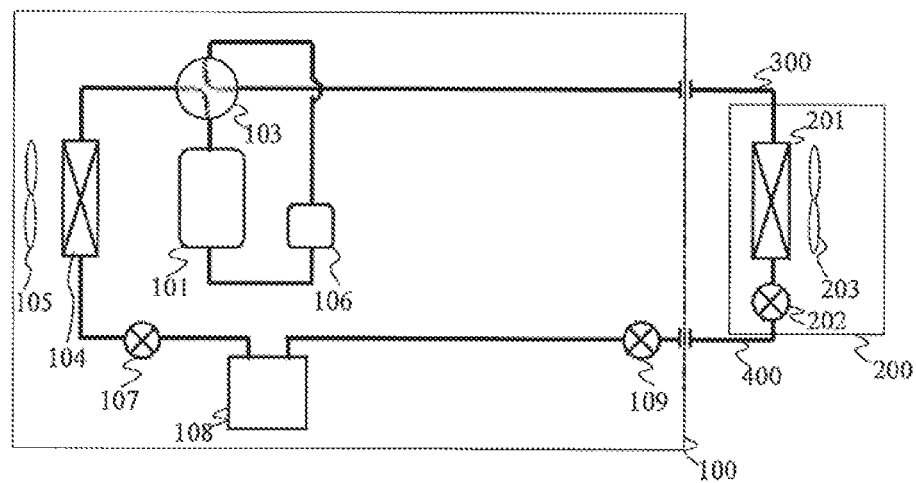
FIG. 22 illustrates the structure of an air-conditioning apparatus according to Embodiment 7 of the present invention.

FIG. 22 illustrates the structure of an air-conditioning apparatus according to Embodiment 7 of the present invention. In the air-conditioning apparatus according to Embodiment 1, as illustrated in FIG. 1, a high-pressure-side portion and a low-pressure-side portion on the main refrigerant circuit are connected to each other by the bypass pipes for bypassing the refrigerant, and the refrigerator 108 is disposed between the bypass pipes in parallel relative to the main refrigerant circuit. As illustrated in FIG. 22, a refrigerator 108 of the air-conditioning apparatus according to Embodiment 7 is disposed on a refrigerant circuit in serial relative to the refrigerant circuit. Consequently, all of the refrigerant circulating through the refrigerant circuit passes through the refrigerator 108. The refrigerator 108 has the same structure as described according to Embodiment 1.

In the air-conditioning apparatus according to Embodiment 2, basically, high-pressure liquid refrigerant having a temperature of more than the ambient temperature passes through the refrigerator 108 during cooling operation, there is no concern about condensation due to decrease in the temperature of the refrigerator 108. During heating operation, low-pressure two-phase refrigerant having a temperature of less than the ambient temperature passes through the refrigerator 108 in some cases, and there is a possibility that the temperature of the refrigerator 108 falls to the dew point or less.

Also, in the air-conditioning apparatus according to Embodiment 7 illustrated in FIG. 22, a cooling plate 2 has a recessed portion 3. Consequently, condensation in an electrical-component storage compartment 6 is prevented from occurring, and corrosion, a short circuit, and breakage of an electrical component due to condensation, for example, can be avoided.

The invention claimed is:

1. A refrigeration cycle apparatus comprising:
a refrigerant circuit through which refrigerant circulates;
a control box in which equipment for controlling the refrigeration cycle apparatus is accommodated; and
a refrigerator for cooling a heat emitting body exposed from an opening of the control box, the heat emitting body being the equipment accommodated in the control box,
the refrigerator including
a cooling body having a heating-body contact surface in contact with the heat emitting body through the opening of the control box, and
a refrigerant pipe through which a part or all of the refrigerant circulating through the refrigerant circuit passes to cool the cooling body, the refrigerant pipe being in contact with a pipe contact surface of the cooling body, the pipe contact surface being different from the heating-body contact surface,
the cooling body is a plate having a rectangular cuboid shape and condensation channels, the condensation channels having two parallel opposing sidewalls and a recessed surface formed between the two parallel opposing sidewalls at which the cooling body and the heat emitting body are not in contact with each other, the recessed surface being formed in the heating-body contact surface and spaced from the control box, and
the cooling body including an inclined endwall configured to catch and drain condensation from the parallel opposing sidewalls, the inclined endwall extending obliquely to the two parallel opposing sidewalls, wherein
the parallel opposing sidewalls and the inclined endwall form a generally U-shaped structure.

2. The refrigeration cycle apparatus of claim 1, wherein the cooling body of the refrigerator is in contact with a plurality of the heating bodies.

3. The refrigeration cycle apparatus of claim 1, wherein the refrigerator includes a plurality of the cooling bodies in contact with a plurality of the heating bodies.

4. The refrigeration cycle apparatus of claim 3, wherein each of the plurality of the cooling bodies has a size depending on cooling capacity to cool the corresponding heating bodies in contact therewith.

5. The refrigeration cycle apparatus of claim 1, wherein a plurality of the pipe contact surfaces of the cooling body are in contact with the refrigerant pipe.

6. The refrigeration cycle apparatus of claim 1, wherein the heat emitting body includes a wide-bandgap semiconductor.

7. The refrigeration cycle apparatus of claim 1, wherein the pipe contact surface of the cooling body has a groove in which the cooling body and the refrigerant pipe are in contact with each other, the groove fitting a shape of the refrigerant pipe.

* * * * *